(12) United States Patent
Furukawa et al.

(10) Patent No.: US 10,584,953 B2
(45) Date of Patent: Mar. 10, 2020

(54) ANGLE DETECTION DEVICE AND ELECTRIC POWER STEERING DEVICE

(71) Applicant: Mitsubishi Electric Corporation, Tokyo (JP)

(72) Inventors: Akira Furukawa, Tokyo (JP); Wakaki Miyaji, Tokyo (JP); Yu Kawano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/766,488

(22) PCT Filed: Nov. 26, 2015

(86) PCT No.: PCT/JP2015/083214
§ 371 (c)(1),
(2) Date: Apr. 6, 2018

(87) PCT Pub. No.: WO2017/090146
PCT Pub. Date: Jun. 1, 2017

(65) Prior Publication Data
US 2018/0292197 A1    Oct. 11, 2018

(51) Int. Cl.
*G01B 7/30* (2006.01)
*G01D 5/14* (2006.01)
(Continued)

(52) U.S. Cl.
CPC ............. *G01B 7/30* (2013.01); *B62D 5/049* (2013.01); *B62D 5/0463* (2013.01);
(Continued)

(58) Field of Classification Search
None
See application file for complete search history.

(56) References Cited

U.S. PATENT DOCUMENTS

| 7,394,247 B1 | 7/2008 | Guo et al. |
| 2010/0045271 A1* | 2/2010 | Tanaka ................. G01D 5/145 324/207.13 |

(Continued)

FOREIGN PATENT DOCUMENTS

| CN | 102445221 A | 5/2012 |
| EP | 1 014 039 A1 | 6/2000 |

(Continued)

OTHER PUBLICATIONS

Extended European Search Report dated Oct. 12, 2018 issued by the European Patent Office in counterpart application No. 15909265.9.

(Continued)

*Primary Examiner* — Clayton E. LaBalle
*Assistant Examiner* — Jas A Sanghera
(74) *Attorney, Agent, or Firm* — Sughrue Mion, PLLC; Richard C. Turner

(57) ABSTRACT

There are arranged a sensor magnet fixed to a rotary shaft and configured to generate a magnetic field for detecting a rotation angle, and a plurality of sensors arranged so as to be opposed to the sensor magnet and each configured to output a sine signal and a cosine signal in accordance with the magnetic field. First and second sensors are arranged on two radial lines different from each other, respectively, out of three radial lines dividing a circumference about the rotary shaft of the sensor magnet into six equal parts. An angle calculation unit is configured to carry out calculation so that 3n-th (n is a natural number) order harmonic components out of odd-order harmonic components of each of the sine signal and the cosine signal output by the first and second sensors cancel one another, to thereby calculate the rotation angle.

16 Claims, 22 Drawing Sheets

(51) Int. Cl.
- *G01D 3/02* (2006.01)
- *B62D 5/04* (2006.01)
- *B62D 15/02* (2006.01)
- *G01D 5/12* (2006.01)
- *G01R 33/09* (2006.01)

(52) U.S. Cl.
CPC ............ *B62D 15/021* (2013.01); *G01D 3/02* (2013.01); *G01D 5/12* (2013.01); *G01D 5/145* (2013.01); *G01R 33/09* (2013.01)

(56) References Cited

U.S. PATENT DOCUMENTS

| | | | | |
|---|---|---|---|---|
| 2011/0087456 | A1* | 4/2011 | Satou | B62D 5/049 702/151 |
| 2012/0095712 | A1* | 4/2012 | Komasaki | G01D 3/036 702/94 |

FOREIGN PATENT DOCUMENTS

| | | |
|---|---|---|
| EP | 2103910 A1 | 9/2009 |
| JP | 60-135768 A | 7/1985 |
| JP | 2529960 B2 | 9/1996 |
| JP | 2006-170837 A | 6/2006 |
| JP | 2008-045881 A | 2/2008 |
| JP | 2009-031292 A | 7/2009 |
| JP | 2013-007731 A | 1/2013 |
| JP | 2015-129660 A | 7/2015 |
| WO | 99/13296 A1 | 3/1999 |
| WO | 2009/031557 A1 | 3/2009 |
| WO | 2009/084346 A1 | 7/2009 |

OTHER PUBLICATIONS

Communication dated Feb. 26, 2019 from Japanese Patent Office in counterpart JP Application No. 2017-552605.
International Search report of PCT/JP2015/083214 filed Feb. 23, 2016.
Communication dated Jul. 31, 2019 from the State Intellectual Property Office of the P.R.C. in application No. 201580084580.X.
Communication dated Oct. 8, 2019 by the Japanese Patent Office in application No. 2017-552605.

* cited by examiner

ANGLE DETECTION DEVICE AND ELECTRIC POWER STEERING DEVICE

CROSS REFERENCE TO RELATED APPLICATIONS

This application is a National Stage of International Application No. PCT/JP2015/083214 filed Nov. 26, 2015.

TECHNICAL FIELD

The present invention relates to an angle detection device and an electric power steering device using the angle detection device.

BACKGROUND ART

Hitherto, there has been known an angle detection device configured so that a sensor magnet is arranged on an end of a rotary shaft, and a semiconductor sensor of a magnetic resistance type is arranged so as to be opposed to the sensor magnet in an axial direction of the rotary shaft (for example, refer to Patent Literature 1).

CITATION LIST

Patent Literature

[PTL 1] JP 2013-7731 A

SUMMARY OF INVENTION

Technical Problem

In Patent Literature 1, a rotating magnetic field of the sensor magnet having a constant magnitude and low spatial distortion is obtained at an angle detection position of the rotation sensor. The semiconductor sensor of the magnetic resistance type uses a bias magnetic field to increase a change rate of the electric resistance, to thereby detect a rotation angle based on a direction of the magnetic field, and can thus achieve a high angle detection precision through the rotating magnetic field having the constant magnitude and the low distortion. Thus, the configuration of the end detection in Patent Literature 1 is general and appropriate as a method for the angle detection.

Meanwhile, when a sensor magnet is arranged around a rotary shaft, and semiconductor sensors of the magnetic resistance type are arranged around the sensor magnet, there is a problem in that the spatial distortion of the magnetic field becomes high, resulting in a low angle detection precision.

The present invention has been made in view of the above-mentioned problem, and has an object to provide an angle detection device having low spatial distortion of a magnetic field and a high angle detection precision.

Solution to Problem

According to one embodiment of the present invention, there is provided an angle detection device including: a sensor magnet, which is fixed to a rotary shaft, and is configured to generate a magnetic field for detecting a rotation angle; a plurality of sensors, which are arranged so as to be opposed to the sensor magnet, and are each configured to generate a sine signal and a cosine signal in accordance with the magnetic field, a first sensor and a second sensor of the plurality of sensors being arranged on two radial lines different from each other, respectively, out of three radial lines dividing a circumference about the rotary shaft of the sensor magnet into six equal parts; and an angle calculation unit configured to carry out calculation so that 3n-th order harmonic components, where n is a natural number, out of odd-order harmonic components of each of the sine signal and the cosine signal output by the first sensor and the second sensor cancel one another, to thereby calculate the rotation angle.

Moreover, according to one embodiment of the present invention, there is provided an electric power steering device including: the above-mentioned angle detection device; and an AC rotary machine configured to generate an assist torque for assisting steering by a driver.

Advantageous Effects of Invention

According to the present invention, the first and second sensors of the plurality of sensors are arranged on the two radial lines different from each other, respectively, out of the three radial lines dividing the circumference about the rotary shaft of the sensor magnet into six equal parts, and the calculation is carried out so that the 3n-th (n is a natural number) order harmonic components out of the odd-order harmonic components of each of the sine signal and the cosine signal output by the first and second sensors cancel one another, to thereby calculate the rotation angle. Thus, harmonic components of the magnetic field, which are the spatial distortion of the magnetic field, and harmonic components of an output voltage caused by the harmonic components can be decreased, thereby enabling the increase in angle detection precision.

BRIEF DESCRIPTION OF DRAWINGS

FIG. 9 are graphs for showing that odd-order harmonic components are contained in the sensor outputs, in which

DESCRIPTION OF EMBODIMENTS

Figure 1:
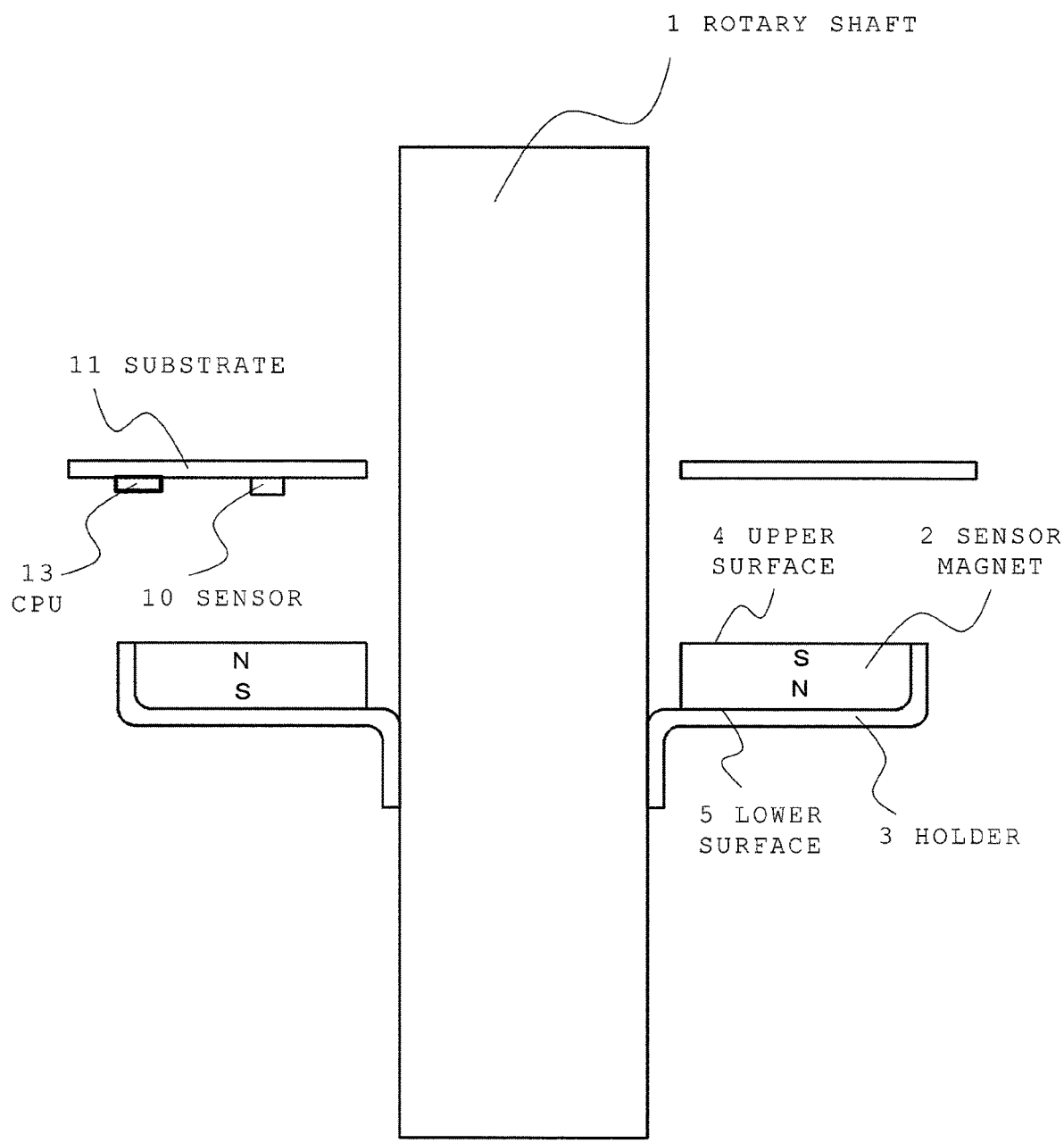
FIG. 1 is a side view for schematically illustrating relative positions of a rotary shaft, a sensor magnet, and semiconductor sensors of a magnetic resistance type in an angle detection device according to a first embodiment of the present invention.

A description is now given of an angle detection device according to each embodiment of the present invention. In the drawings, the same or corresponding components or parts are indicated by the same reference symbols.

First Embodiment

In an angle detection device according to a first embodiment of the present invention illustrated in FIG. 1, a sensor magnet 2 and a holder 3 configured to fix the sensor magnet 2 are integrally fixed to a rotary shaft 1 of a permanent magnet motor at a part of the rotary shaft 1. The sensor magnet 2 is an injection-molded bonded neodymium magnet, and is formed to have a ring shape integrally with the holder 3. The sensor magnet 2 is magnetized in a so-called double-sided four-pole configuration. That is, respective halves of an upper surface 4 in an axial direction of the sensor magnet 2 are magnetized to the N pole and the S pole, and a lower surface 5 in the axial direction is magnetized oppositely to the upper surface 4 in the polarity.

In other words, the magnetic field formed by the sensor magnet 2 has a magnetic field distribution in which a magnetic field extends from the N pole along the axial direction to the S pole. A description is given below of a case of the magnetization in the axial direction, but the same effects can be provided even in a case of magnetization in a different direction, for example, the radial direction.

The sensor magnet 2 is integrally fixed to the rotary shaft 1 through press fitting or the like via the holder 3 made of a non-magnetic material or a magnetic material, and is configured to rotate in synchronization with the rotation of the rotary shaft 1. In order to decrease leakage flux from the magnetic material to the rotary shaft 1, an inner periphery of the sensor magnet 2 and an outer periphery of the rotary shaft 1 are arranged so as to be separated from each other.

Sensors 10 of the magnetic resistance type are provided above the sensor magnet 2 so as to be opposed to the upper surface 4 of the sensor magnet 2. Those sensors 10 are fixed to a lower surface of a substrate 11, and are connected to a CPU 13 serving as an angle calculation unit described later. For the sake of simplification of the drawing, other electronic components, wiring patterns, mounting holes, and the like constructing the angle detection device are not shown.

The sensor 10 detects a rotating magnetic field direction 12, which is parallel with a plane perpendicular to the rotary shaft 1, namely, the substrate 11. A plurality of bridge circuits (not shown) configured to detect the rotating magnetic field direction are built into the sensor 10, and the number of pairs of the bridge circuits having the detection directions different by 90 degrees from one another with respect to the rotating magnetic field direction 12 is one or two.

The CPU 13 detects the rotation angle based on signals obtained by the sensors 10. For example, when the angle detection device according to this embodiment is installed on a brushless motor, motor control is to be carried out based on this rotation angle.

Figure 2:
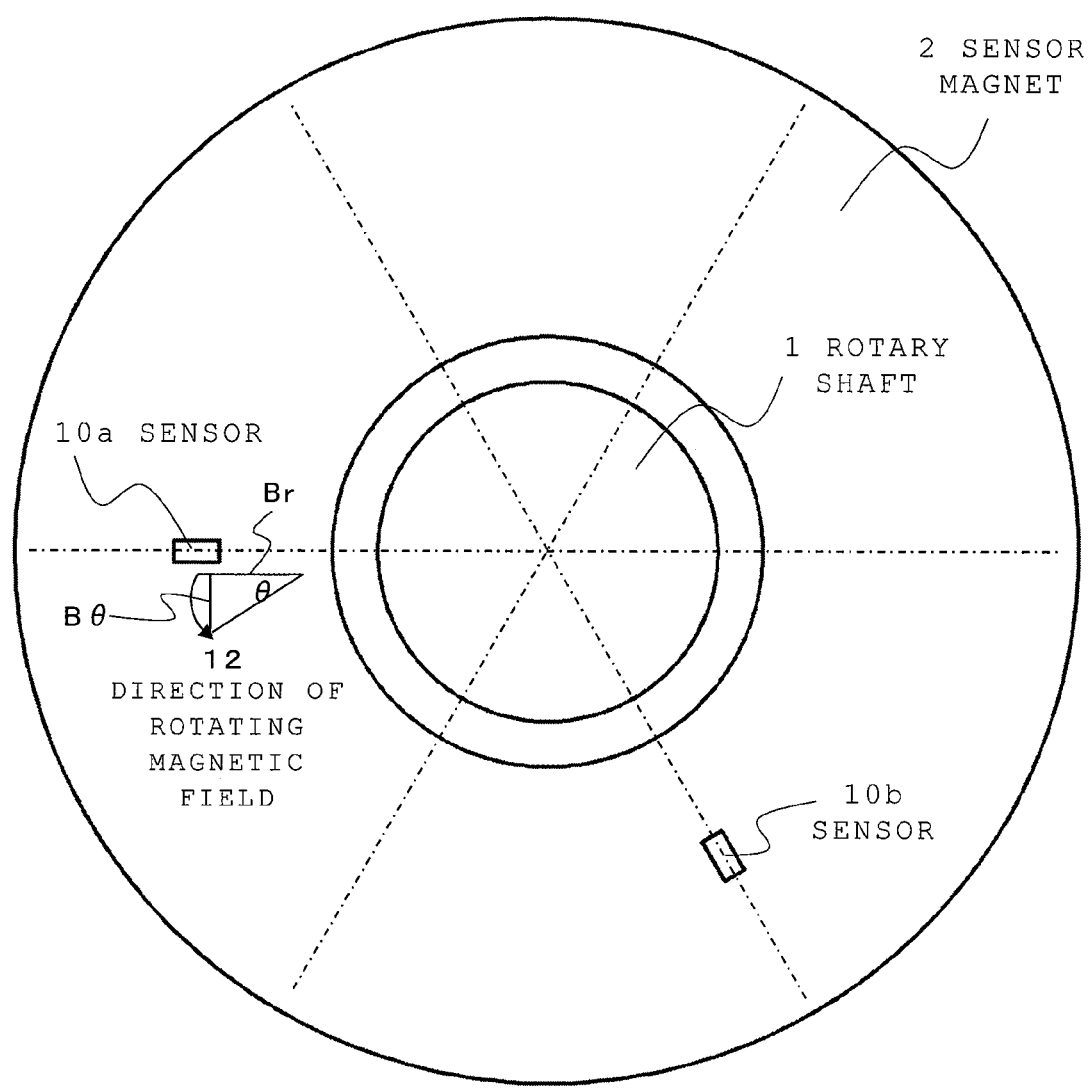
FIG. 2 is a plan view for schematically illustrating relative positions of the rotary shaft, the sensor magnet, and the semiconductor sensors of the magnetic resistance type in the angle detection device according to the first embodiment of the present invention.

As illustrated in FIG. 2, the sensors 10 include a sensor 10a and a sensor 10b arranged at radial positions displaced from each other by 120 degrees about the rotary shaft 1 on the lower surface of the substrate 11. The holder 3 and the substrate 11 are not shown in FIG. 2.

Figure 3:
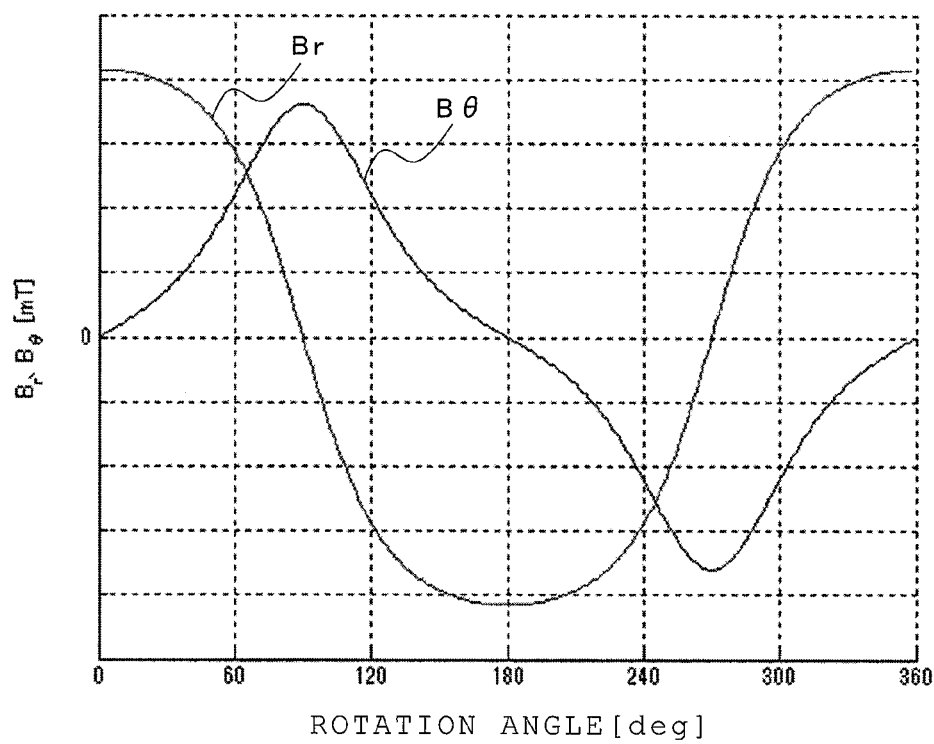
FIG. 3 is a waveform diagram for showing changes in a magnitude and a direction of a magnetic field at a position of one rotation sensor exhibited when the rotary shaft rotates once in the angle detection device according to the first embodiment of the present invention.

In FIG. 3, changes in a magnitude and a direction of the rotating magnetic field direction 12 at the position of the sensor 10a exhibited when the rotary shaft 1 and the sensor magnet 2 rotate once are shown. A radial direction component is represented by Br, and a peripheral direction component is represented by Bθ. In the case of a general end detection (sensors are installed on the rotary shaft), the magnitude of the magnetic field is constant, and the spatial distortion of the magnetic field is small. Thus, and the magnetic distribution provides a first order sine waveform. However, in the case of the outer periphery detection, the sensor positions are displaced from the rotation center, which causes such a spatial magnetic field distribution that odd-order harmonic components are superimposed on a sine wave. In the following, a description may be given while the "harmonic components" are omitted.

Figure 4:
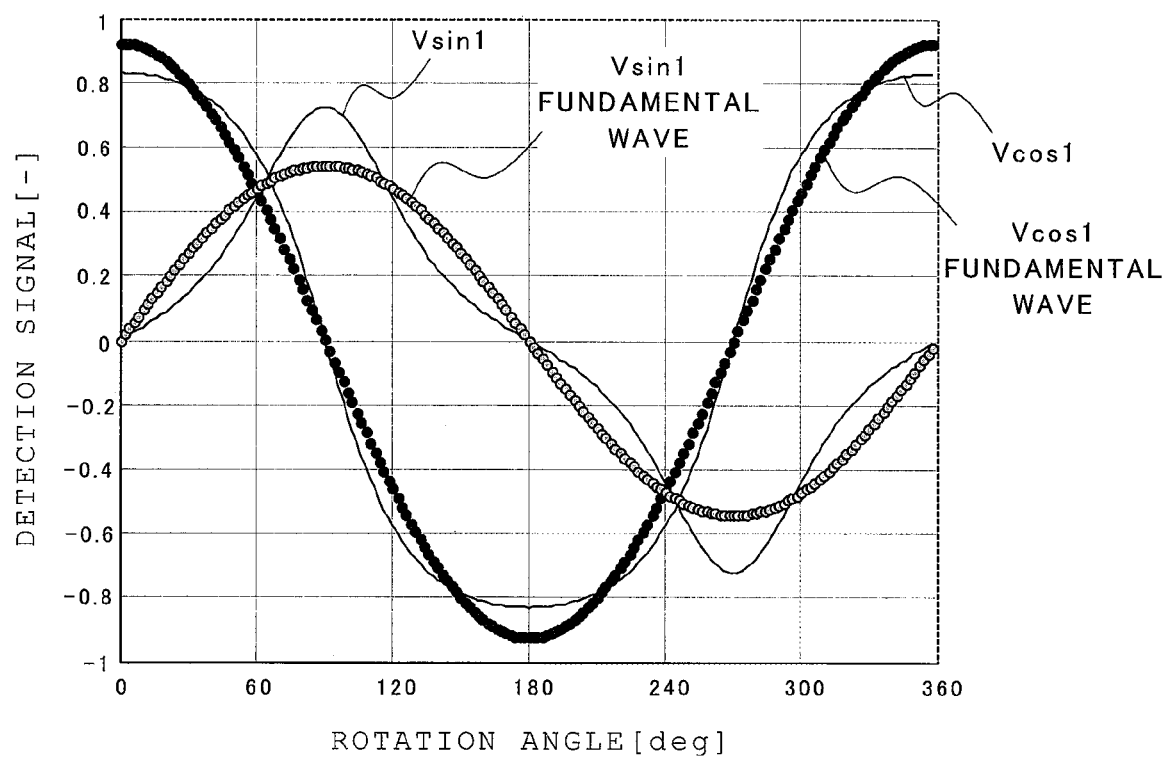
FIG. 4 is a waveform diagram for showing waveforms of fundamental waves superimposed on the waveform diagram of FIG. 3 while the rotation angle is assigned to the horizontal axis and output signals from the sensor are assigned to the vertical axis.

Referring to FIG. 4, a description is given of, for example, a case in which the sensor 10a is a sensor configured to detect Br as a cosine (COS) signal V cos 1 and Bθ as a sine (SIN) signal V sin 1, and the sensor 10b is a sensor configured to detect Br as a cosine (COS) signal V cos 2 and Bθ as a sine (SIN) signal V sin 2. FIG. 4 is a waveform diagram in which the rotation angle is assigned to the horizontal axis, for showing the waveforms of fundamental wave components superimposed on the output signals of the sensor 10a shown in FIG. 3.

Figure 5:
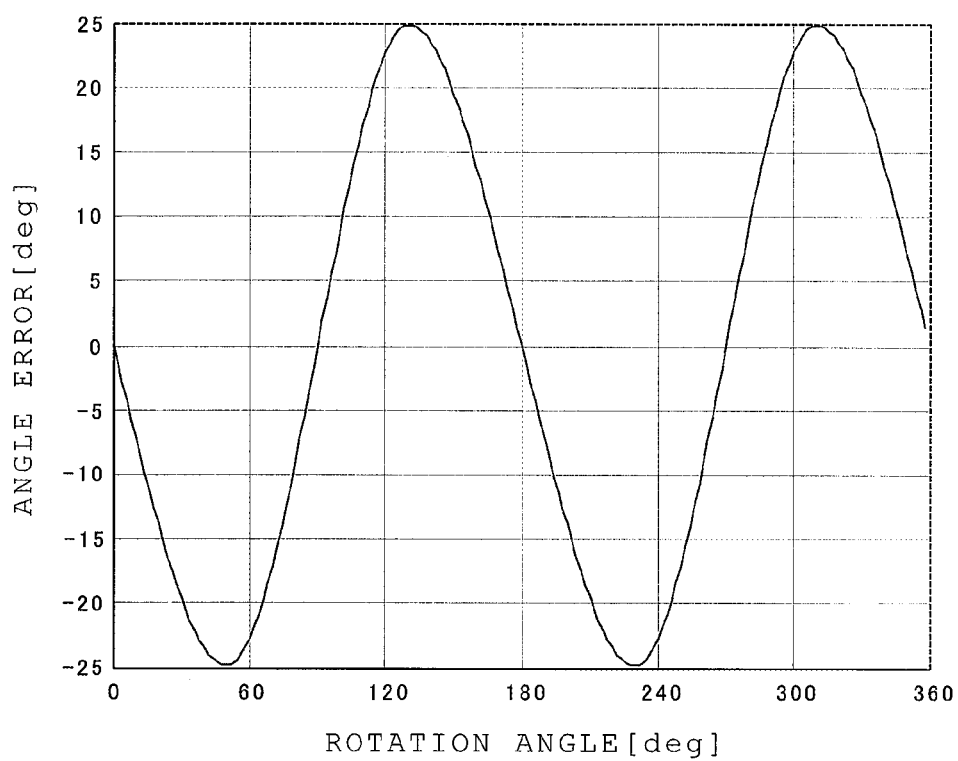
FIG. 5 is a waveform diagram for showing an angle error component of almost the second order in the waveforms of FIG. 4.

Regarding the sensor 10a, the amplitude of the fundamental wave of the cosine signal V cos 1 is larger than the amplitude of the cosine signal V cos 1. Regarding the sine signal V sin 1, the amplitude of the fundamental wave is smaller than the amplitude of the sine signal V sin 1. When the fundamental waves are compared with each other, the amplitudes of the fundamental waves of the cosine signal V cos 1 and the sine signal V sin 1 are greatly different from each other. In other words, the amplitude ratio between both the fundamental waves is not 1, which appears as a second order angle error. Moreover, a difference between the original signal and the fundamental wave corresponds to an error signal, and, in terms of the amplitude relationship between the fundamental wave and the original signal, the amplitude relationship switches three times in one rotation. Thus, a signal error contains a third order component greatly. Moreover, the phase of a third order component contained in the cosine signal V cos 1 advances by approximately 90 degrees with respect to the phase of a third order component contained in the sine signal V sin 1, and the third order component contained in the cosine signal V cos 1 has approximately the same amplitude as that of the third order component contained in the sine signal V sin 1, which also appears as a second order angle error. In other words, in this case, as shown in FIG. 5, the angle error is mainly the second order angle error.

Figure 6:
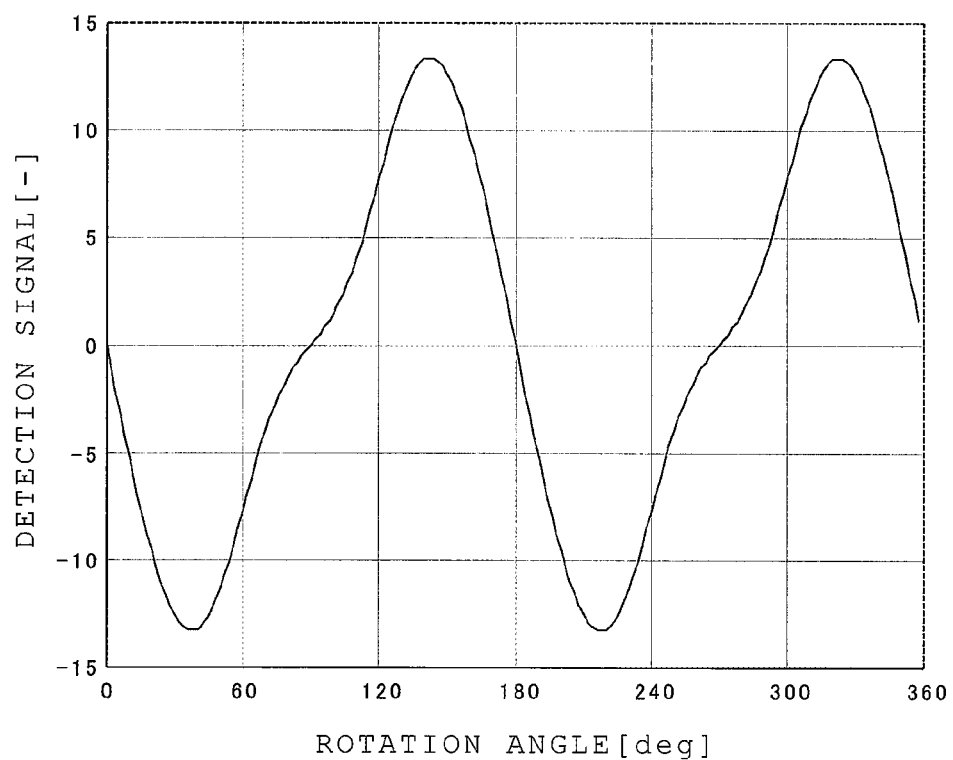
FIG. 6 is a waveform diagram for showing an angle error component of the fourth order other than the angle error component of the almost second order in the waveforms of FIG. 4.
Figure 7:
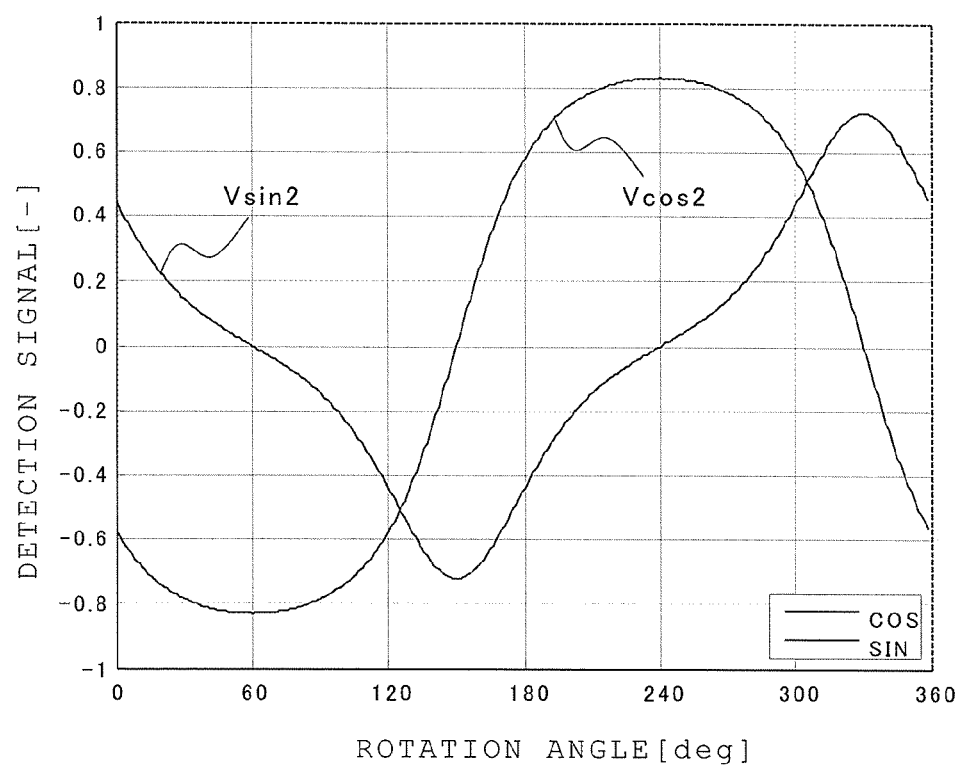
FIG. 7 is a waveform diagram for showing a cosine signal and a sine signal having a phase each advanced by 120 degrees with respect to the cosine signal and the sine signal of FIG. 3.

The second order angle error caused by the difference between the amplitudes of the fundamental waves can be decreased by correcting the amplitudes. As shown in FIG. 6, when a product of the amplitude ratio between the amplitudes of the respective fundamental waves and the sine signal V sin 1 and the cosine signal V cos 1 are used to calculate the angle (in a case of Expression (5) described later), an angle error presents a large fourth order error component in addition to the second order error component. The large fourth order error component is caused by a displacement generated in the amplitude ratio of each of the harmonic components of the third order or more as a result of the multiplication of the original signal by the gain in accordance with the amplitude ratio between the respective fundamental waves.

Figure 8:
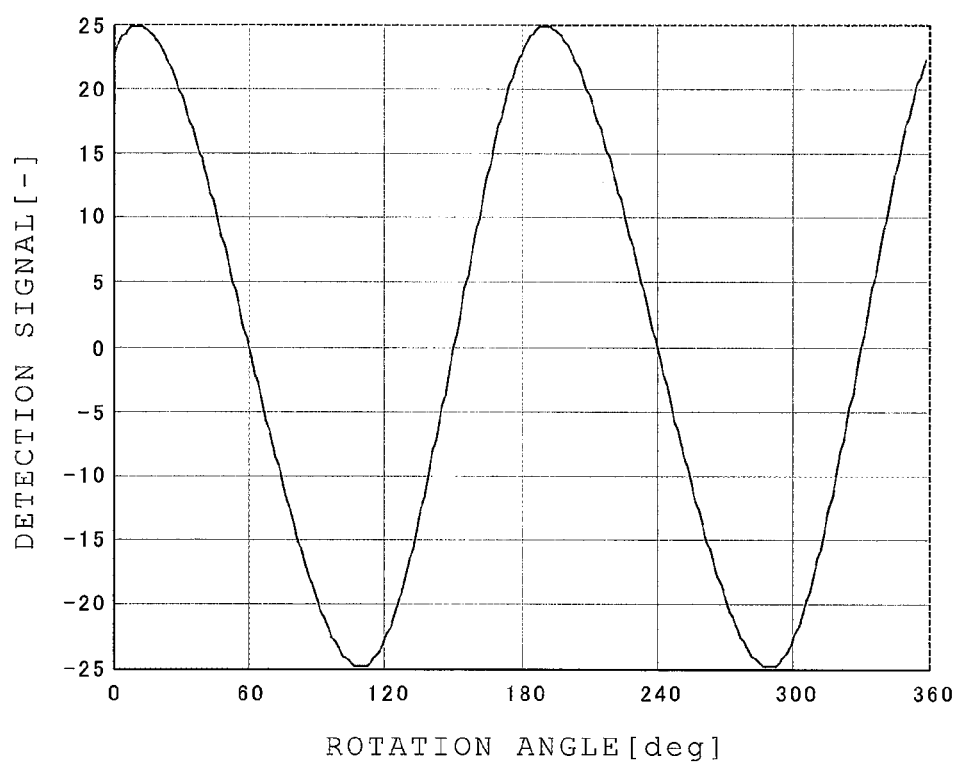
FIG. 8 is a waveform diagram for showing an angle error component of the almost second order, which is contained in a rotation angle calculated from the cosine signal and the sine signal of FIG. 7.

Meanwhile, the sensor 10b is arranged at the position advanced in the phase by 120 degrees with respect to the sensor 10a, and hence the cosine signal V cos 2 and the sine signal V sin 2 output by the sensor 10b have phases advanced by 120 degrees with respect to the phases of the cosine signal V cos 1 and the sine signal V sin 1 of FIG. 4, respectively. On this occasion, as shown in FIG. 8, an error contained in the rotation angle calculated from the cosine signal V cos 2 and the sine signal V sin 2 is mainly an angle error of the second order.

Figure 9A:
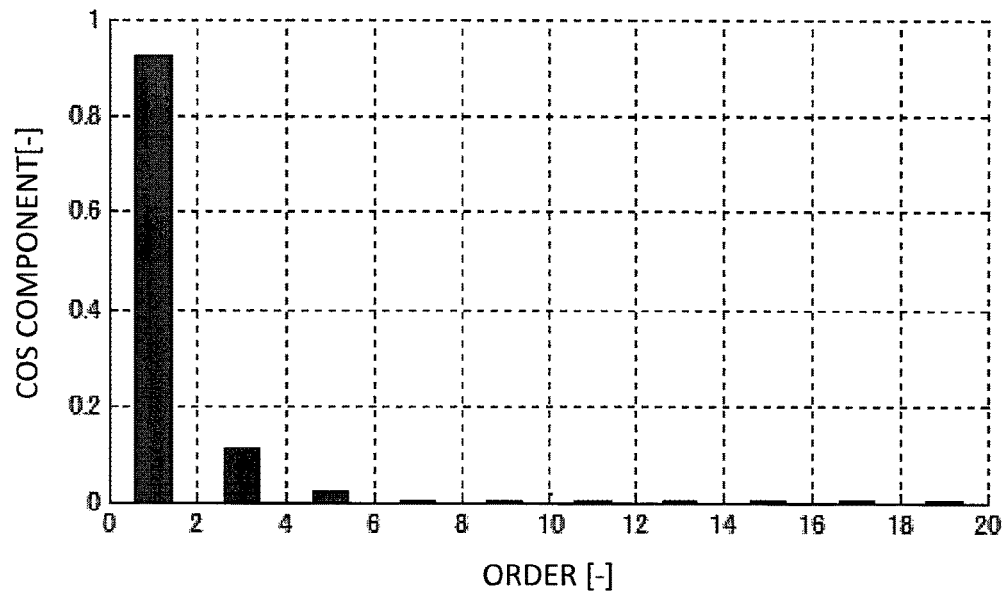
FIG. 9A and FIG. 9B are graphs for showing that the odd-order harmonic components are contained in the cosine signal and the sine signal, respectively.
Figure 9B:
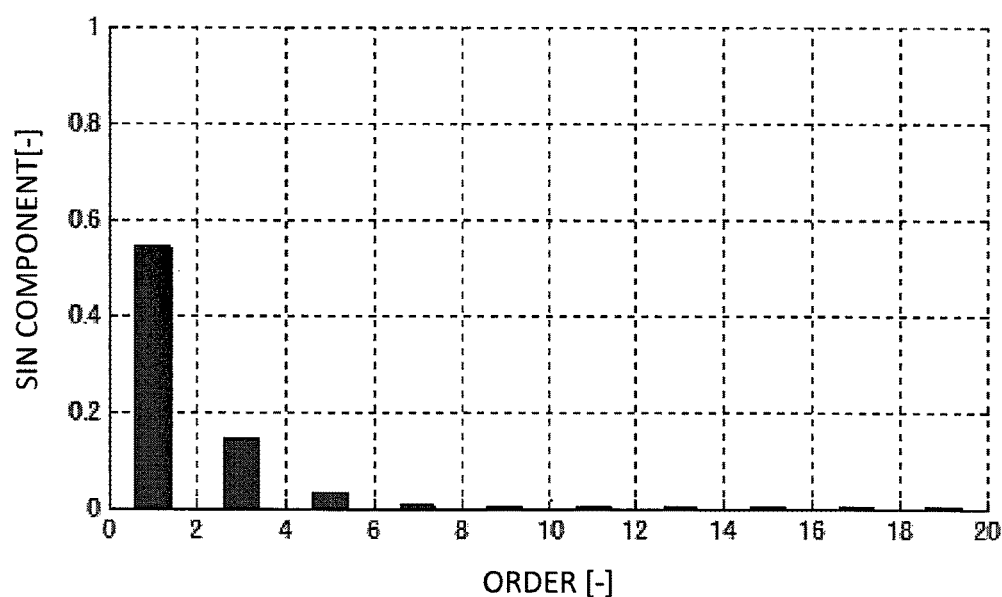

Moreover, as shown in FIG. 9A and FIG. 9B, harmonic components of (2n−1)th order (n is a natural number), namely, odd-order harmonic components, are contained in the cosine signal V cos 1 and the sine signal V sin 1. As shown in FIG. 4, the cosine signal has the large amplitude of the first order component, which is the fundamental wave, and the sine signal has the large amplitudes of other (2n+1)th order components.

Thus, the cosine signal V cos 1 and the sine signal V sin 1 output by the sensor 10a can be approximated as an expression of sums of (2n+1)th order components, namely, odd-order components, as given by Expression (1). In the expressions, an and do (n is a natural number) are coefficients, which are positive numbers or zeros.

$$\begin{cases} V_{cos1} = a_1\cos\theta - a_3\cos3\theta + a_5\cos5\theta - a_7\cos7\theta + \Lambda \\ V_{sin1} = d_1\sin\theta - d_3\sin3\theta + d_5\sin5\theta - d_7\sin7\theta + \Lambda \end{cases} \quad \text{Expression (1)}$$

On this occasion, the sensor 10a and the sensor 10b have the phases different from each other by 120 degrees, and the cosine signal V cos 2 and the sine signal V sin 2 output by the sensor 10b can thus be approximated as expressions of sums of (2n+1)th order components as given by Expression (2). As can be found from a comparison between Expression (1) and Expression (2), 3m-th (m is a natural number) order components (second terms on the right side of Expressions (1) and (2)) have the same phase.

$$\begin{cases} V_{cos2} = a_1\cos(\theta + 120) - a_3\cos3\theta + a_5\cos(5\theta - 120) - \\ \qquad a_7\cos(7\theta + 120) + \Lambda \\ V_{sin2} = d_1\sin(\theta + 120) - d_3\sin3\theta + d_5\sin(5\theta - 120) - \\ \qquad d_7\sin(7\theta + 120) + \Lambda \end{cases} \quad \text{Expression (2)}$$

Figure 10:
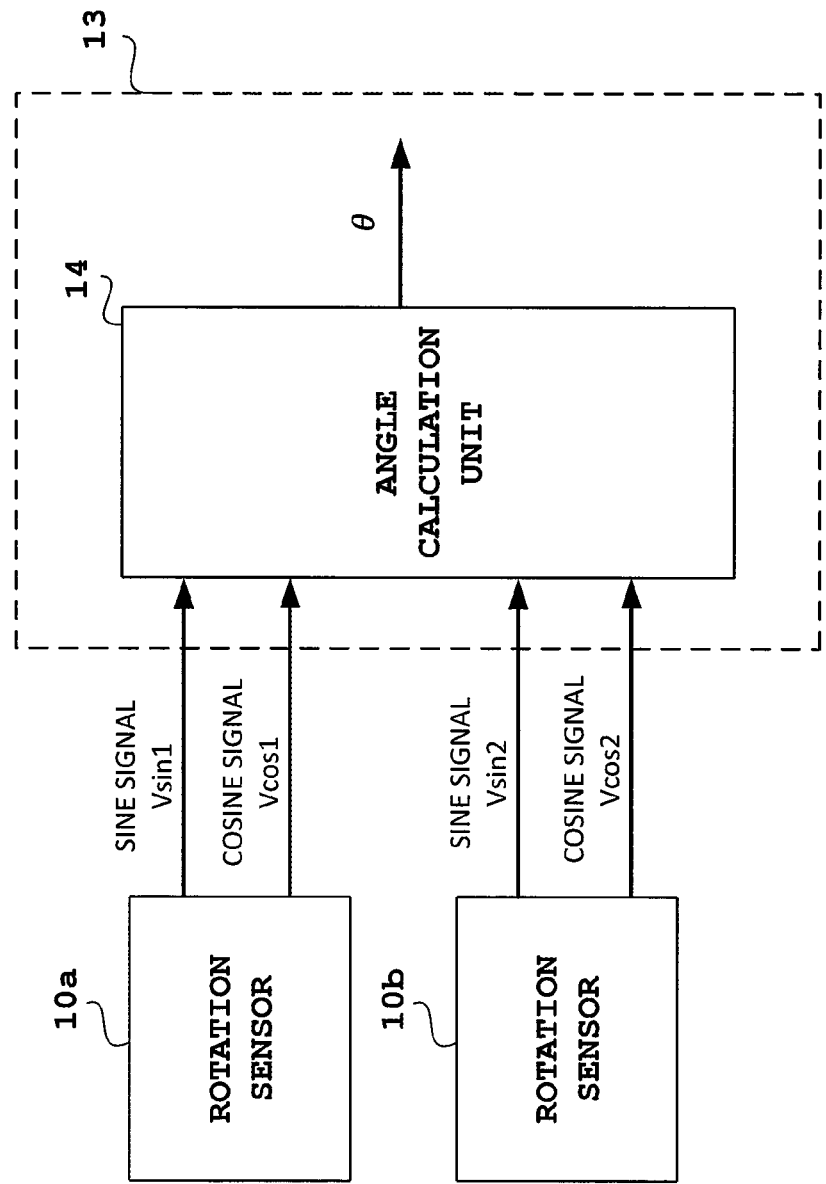
FIG. 10 is a block diagram for illustrating a configuration of the angle detection device according to the first embodiment of the present invention.

FIG. 10 is a diagram for illustrating an example of an internal configuration of the angle detection device according to the first embodiment. The sensor 10a outputs Br as the cosine signal V cos 1 and outputs Bθ as the sine signal V sin 1. The sensor 10b outputs Br as the cosine signal V cos 2 and outputs Bθ as the sine signal V sin 2. An angle calculation unit 14 included in the CPU 13 calculates the rotation angle θ based on the cosine signals and the sine signals acquired from the sensor 10a and the sensor 10b.

Figure 11:
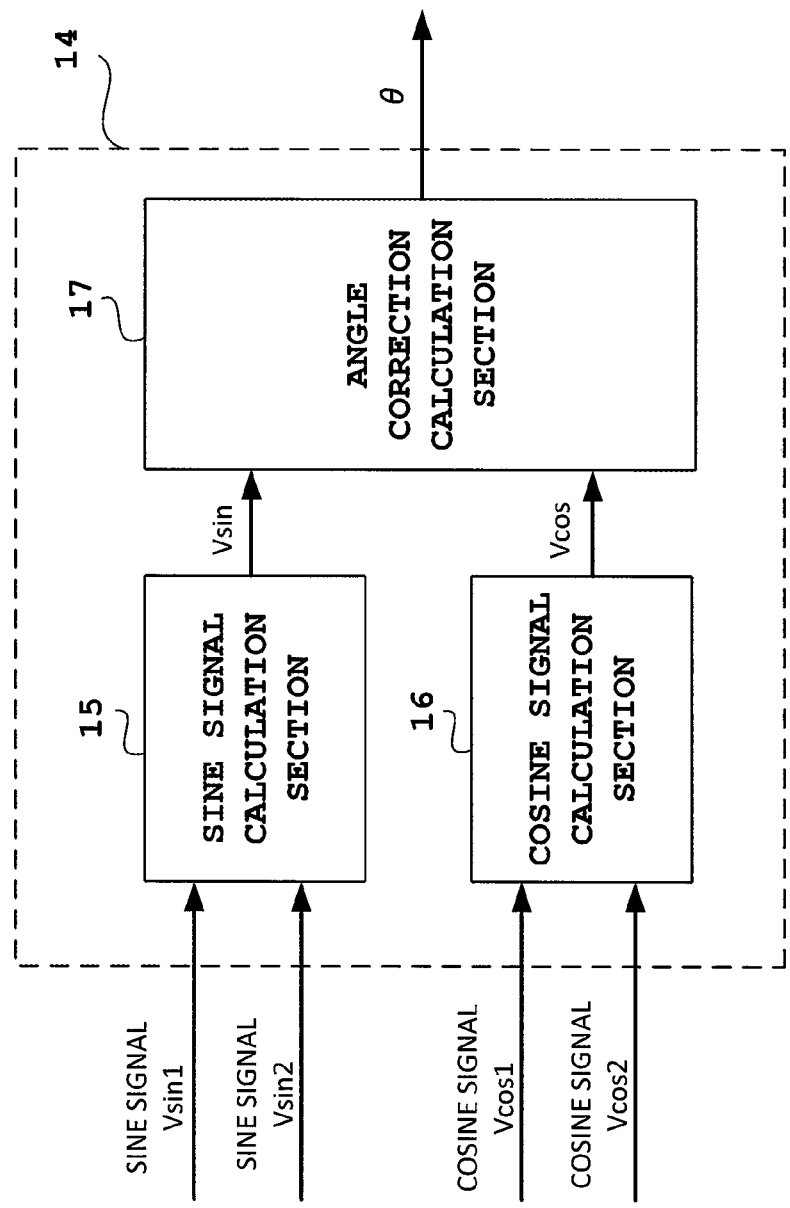
FIG. 11 is a block diagram for illustrating an example of an internal configuration of an angle calculation unit illustrated in FIG. 10.

An example of an internal configuration of the angle calculation unit 14 is illustrated in FIG. 11. As given by Expression (3), a sine signal calculation section 15 calculates a corrected sine signal V sin obtained as a difference between the sine signal V sin 1 and the sine signal V sin 2 in order to cancel the 3m-th order components. As given by Expression (4), a cosine signal calculation section 16 calculates a corrected cosine signal V cos obtained as a difference between the cosine signal V cos 1 and the cosine signal V cos 2 in order to cancel the 3m-th order components.

$$\begin{aligned} V_{sin} &= V_{sin1} - V_{sin2} \\ &= \sqrt{3}\left\{ \begin{array}{l} d_1\sin(\theta - 30) + d_5\sin(5\theta + 30) - \\ d_7\sin(7\theta - 30) + \Lambda \end{array} \right\} \end{aligned} \quad \text{Expression (3)}$$

-continued $$V_{cos} = V_{cos1} - V_{cos2} \quad \text{Expression (4)}$$
$$= \sqrt{3} \left\{ \begin{array}{c} a_1\cos(\theta - 30) + a_5\cos(5\theta + 30) - \\ a_7\cos(7\theta - 30) + \Lambda \end{array} \right\}$$

An angle correction calculation section 17 calculates the rotation angle θ from the corrected sine signal V sin and the corrected cosine signal V cos based on Expression (5). The angle is calculated through use of signals obtained by subtracting signals each having the phase displaced by 120 degrees from the signals having the same phase, and hence an angle obtained by displacing the phase by 30 degrees (deg) is the rotation angle θ to be calculated.

Moreover, as shown in FIG. 9, the amplitudes of the fundamental waves of the cosine component and the sine component are different from each other, and hence a coefficient k of Expression (5) may be the ratio between the amplitudes of the respective fundamental waves of the corrected sine signal V sin and the corrected cosine signal V cos. On this occasion, a simple arctangent function is used, but it should be understood that signals corrected through publicly known methods may be used when the respective signals include errors, for example, offset errors. Moreover, in Expression (5), the corrected sine signal V sin is multiplied by the coefficient k, but it should be understood that the corrected cosine signal V cos may be multiplied by the coefficient.

$$\theta = \tan^{-1}\left(\frac{kV_{sin}}{V_{cos}}\right) + 30 \text{ [deg]} \quad \text{Expression (5)}$$

Figure 12:
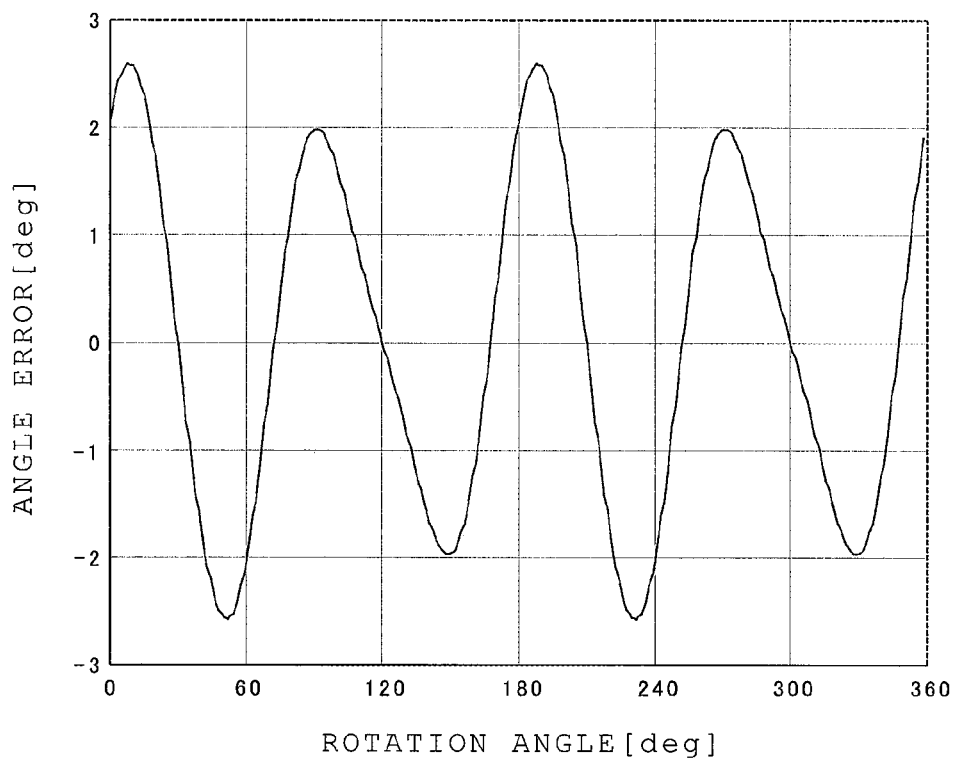
FIG. 12 is a waveform diagram for showing an angle error mainly containing the fourth order component after the second order component is decreased to approximately zero as an angle error contained in a rotation angle obtained by the angle calculation unit illustrated in FIG. 11.

As shown in FIG. 12, an angle error contained in the rotation angle θ obtained by the angle calculation unit 14 while the coefficient k of Expression (5) is set to the ratio between the amplitudes of the respective fundamental waves is an angle error containing the second order component decreased to approximately zero, and is mainly the fourth order component. Thus, the angle error can be decreased to a sufficiently small value compared with an angle error obtained when each of the sensor 10a and the sensor 10b is solely used.

Further, the angle correction calculation section 17 may calculate a rotation angle θ' corrected once by subtracting the 2n-th (n is a natural number of 2 or more) order components from the rotation angle θ as given by Expression (6). In this case, θ obtained in accordance with Expression (5) is used, and the error is thus additionally contained compared with a case in which a correction amount is determined from the true value of the angle. However, as shown in FIG. 12, Expression (6) for the correction is used after the angle error is decreased, and hence the error contained in e and correction coefficients k4, k6, and k8 are minute. Thus, an expected effect can be provided.

$$\theta' = \theta - k_4 \sin 4\theta - k_6 \sin 6\theta - k_8 \sin 8\theta \quad \text{Expression (6)}$$

Figure 13:
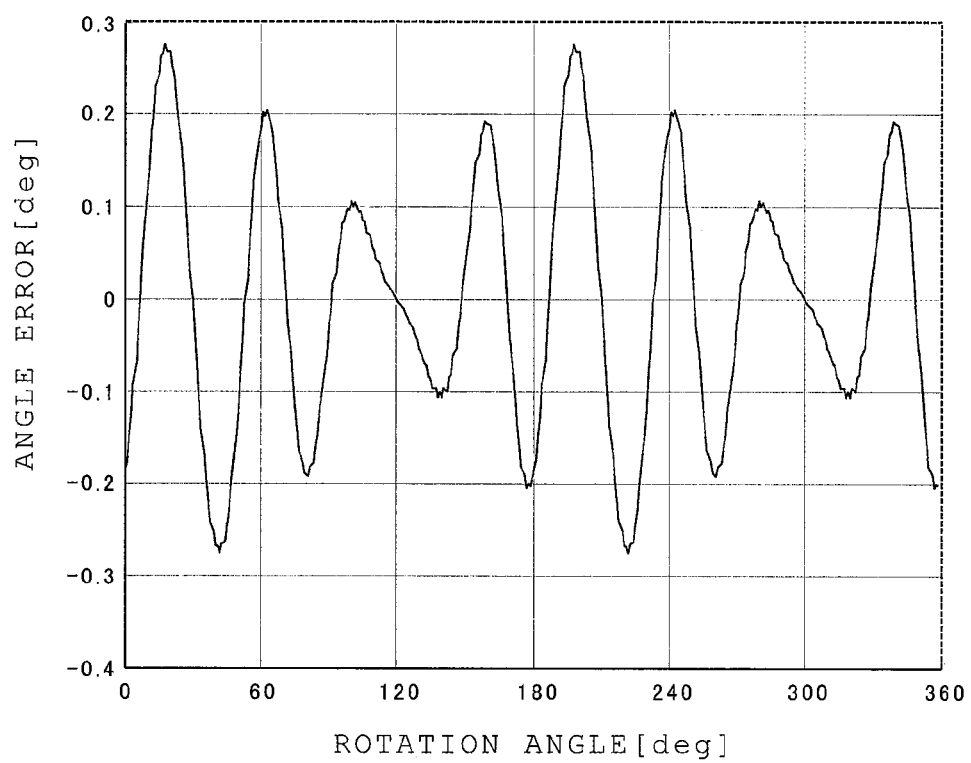
FIG. 13 is a waveform diagram for showing a state in which the angle error shown in FIG. 12 is corrected once so as to be decreased to a minute value.

Thus, the angle error contained in the rotation angle θ' corrected once, which is obtained by the angle calculation unit 14, can be decreased to a minute value shown in FIG. 13. On this occasion, the correction formula assumes that an initial phase determined by the sensor magnet 2 and the sensors 10a and 10b when n=1 is 0 degrees, but may be a correction formula reflecting an initial phase in accordance with an actual error component.

Further, when an expected precision is not obtained for the rotation angle θ' corrected once in accordance with Expression (6), the rotation angle θ' corrected once may be used to further calculate a rotation angle θ" corrected twice in accordance with Expression (7).

$$\theta'' = \theta - k_4 \sin 4\theta' - k_6 \sin 6\theta' - k_8 \sin 8\theta' \quad \text{Expression (7)}$$

Figure 14:
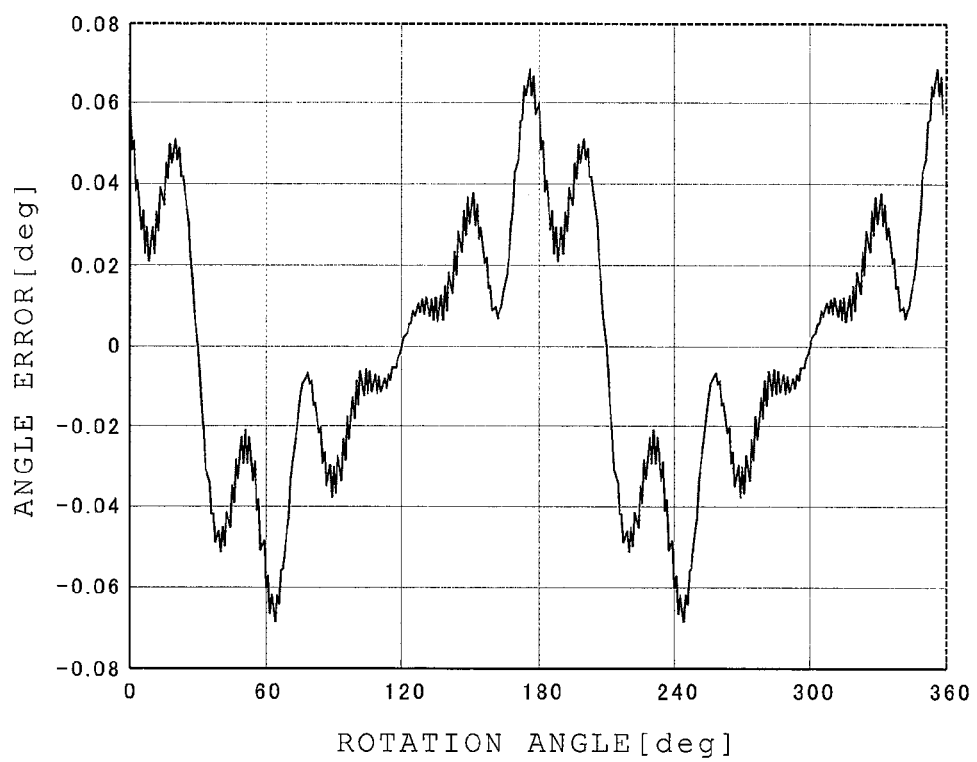
FIG. 14 is a waveform diagram for showing a state in which the angle error shown in FIG. 12 is corrected twice so as to be a further minute value.

As shown in FIG. 14, an angle error contained in the rotation angle θ" corrected twice can further be decreased to a minute value. On this occasion, the correction is made twice, but because error components of a high order increase when the original error is large, correction may be made a larger number of times in order to decrease a component of a certain order having the maximum amplitude.

Figure 15:
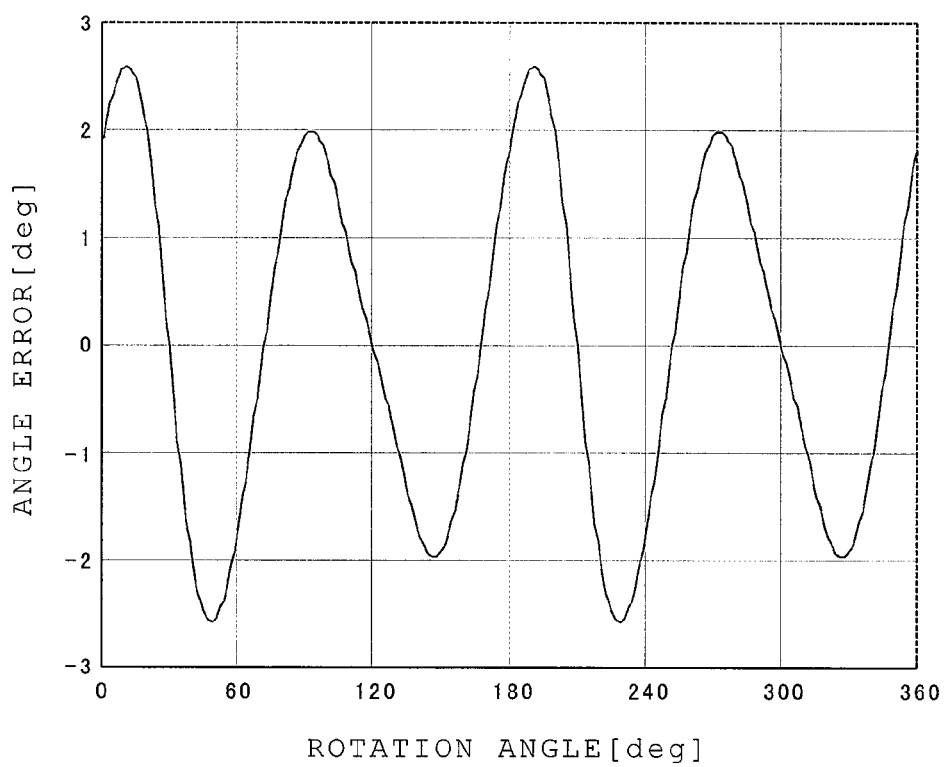
FIG. 15 is a diagram for showing a table of the rotation angle and an angle error correction value, which is used for angle error correction.
Figure 16:
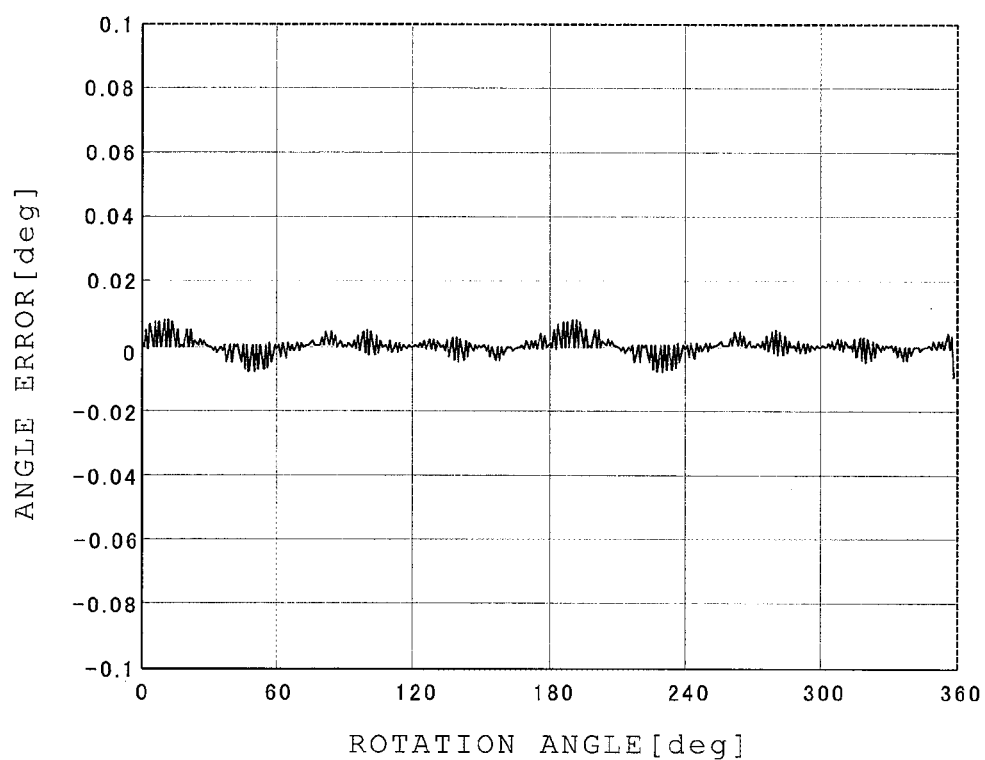
FIG. 16 is a waveform diagram for showing a result of correction for high-order angle errors, which is carried out through use of the table shown in FIG. 15.

Expression (7) is a correction formula for the 4th, 6th, and 8th order components, but may be a correction formula for 2n-th (n is a natural number of 2 or more) order components including further higher order components, or a correction formula limited to components of a required order. When a table of the rotation angle and an angle error correction value shown in FIG. 15 is used instead of a correction formula, as shown in FIG. 16, an effect of decreasing high-order angle errors is provided.

A description has been given of a case in which the sensor 10b is arranged at the position having the phase advanced by 120 degrees with respect to the sensor 10a. However, it should be understood that the same effect is provided even when the sensor 10b is arranged at a position having a phase lagged by 120 degrees, because the relationship between the phases of the sensor 10b and the sensor 10a is only reversed.

Figure 17:
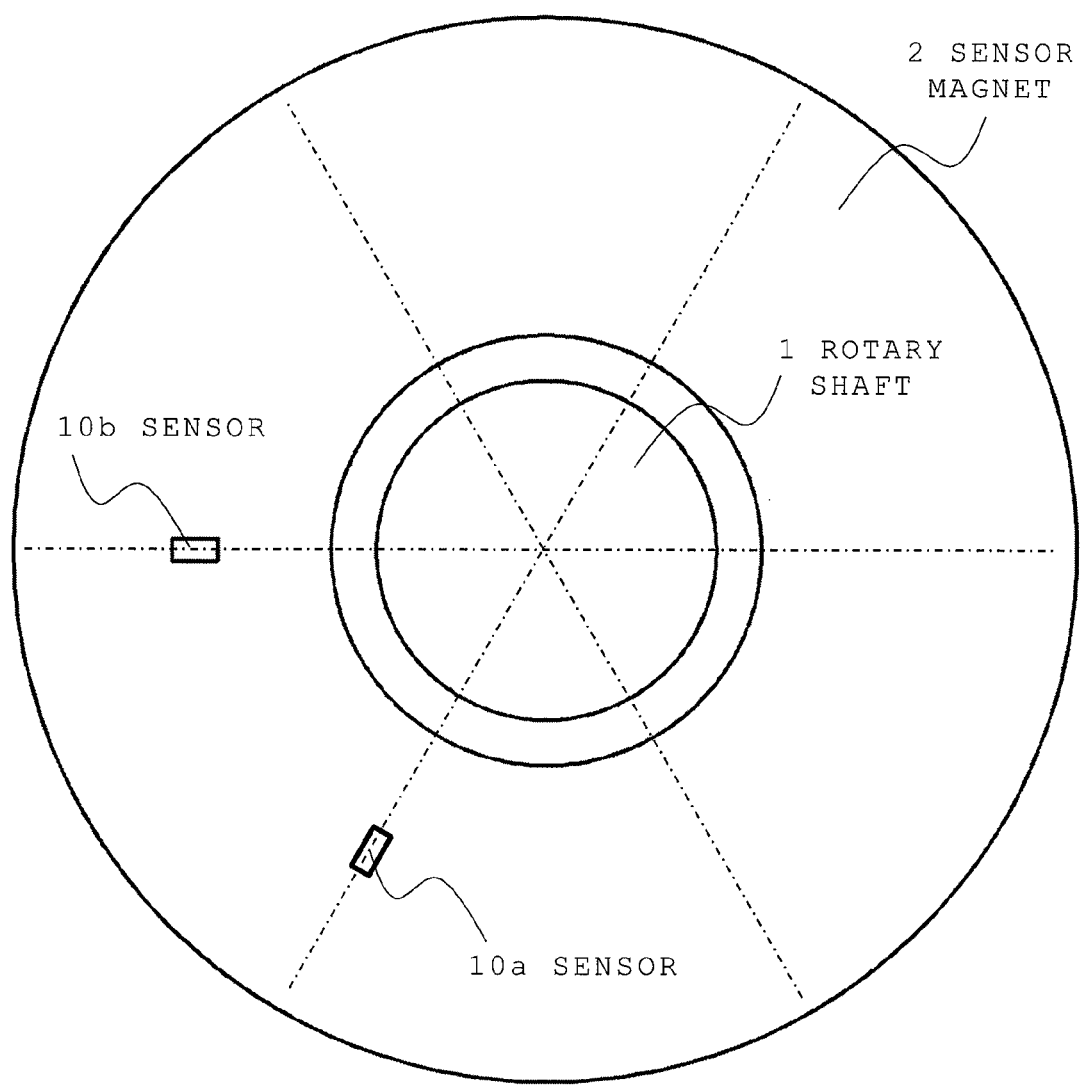
FIG. 17 is a plan view for schematically illustrating relative positions of the rotary shaft, the sensor magnet, and the semiconductor sensors of the magnetic resistance type in a state in which the two sensors are arranged at a phase difference of 60 degrees in the angle detection device according to the first embodiment of the present invention.

Further, as illustrated in FIG. 17, even when the sensor 10b is arranged at a position having a phase lagged by 60 degrees with respect to the sensor 10a, the same effect is also provided through use of a sine signal calculation section 15a and a cosine signal calculation section 16a. In this case, the cosine signal V cos 2 and the sine signal V sin 2 output by the sensor 10b can be approximated as an expression given by Expression (8). As can be found from comparison between Expression (2) and Expression (8), the signals obtained in the case of Expression (8) are inversions of the signals obtained when the sensor 10b is arranged at the position having the phase advanced by 120 degrees.

Expression (8)
$$\begin{cases} V_{cos2} = a_1\cos(\theta - 60) + a_3\cos3\theta + a_5\cos(5\theta + 60) - a_7\cos(7\theta - 60) + \Lambda \\ V_{sin2} = d_1\sin(\theta - 60) + d_3\sin3\theta + d_5\sin(5\theta + 60) - d_7\sin(7\theta - 60) + \Lambda \end{cases}$$

Thus, as given by Expression (9), the sine signal calculation section 15 illustrated in FIG. 11 may also calculate the corrected sine signal V sin as a sum of the sine signal V sin 1 of Expression (1) and the sine signal V sin 2 of Expression (8) in order to cancel the 3m-th order components. Moreover, as given by Expression (10), the cosine signal calculation section 16 may also calculate the corrected cosine signal V cos as a sum of the cosine signal V cos 1 of Expression (1) and the cosine signal V cos 2 of Expression (8) in order to cancel the 3m-th order components.

$$V_{sin} = V_{sin\ 1} + V_{sin\ 2} \quad \text{Expression (9)}$$

$$V_{cos} = V_{cos\ 1} + V_{cos\ 2} \quad \text{Expression (10)}$$

Moreover, the angle correction calculation section 17 calculates the rotation angle θ from the corrected sine signal V sin and the corrected cosine signal V cos based on Expression (5), to thereby be able to decrease the angle error to a sufficiently small value compared with an angle error obtained when each of the sensor 10a and the sensor 10b is solely used. Expression (6), Expression (7), and the table of the rotation angle and the angle error correction value may be used to decrease further high-order angle errors.

It should be understood that an electric power steering device in which torque ripple is decreased can be provided when the angle detection device according to the first embodiment is applied to an AC rotary machine configured to generate an assist torque for assisting steering by a driver.

Second Embodiment

Figure 18:
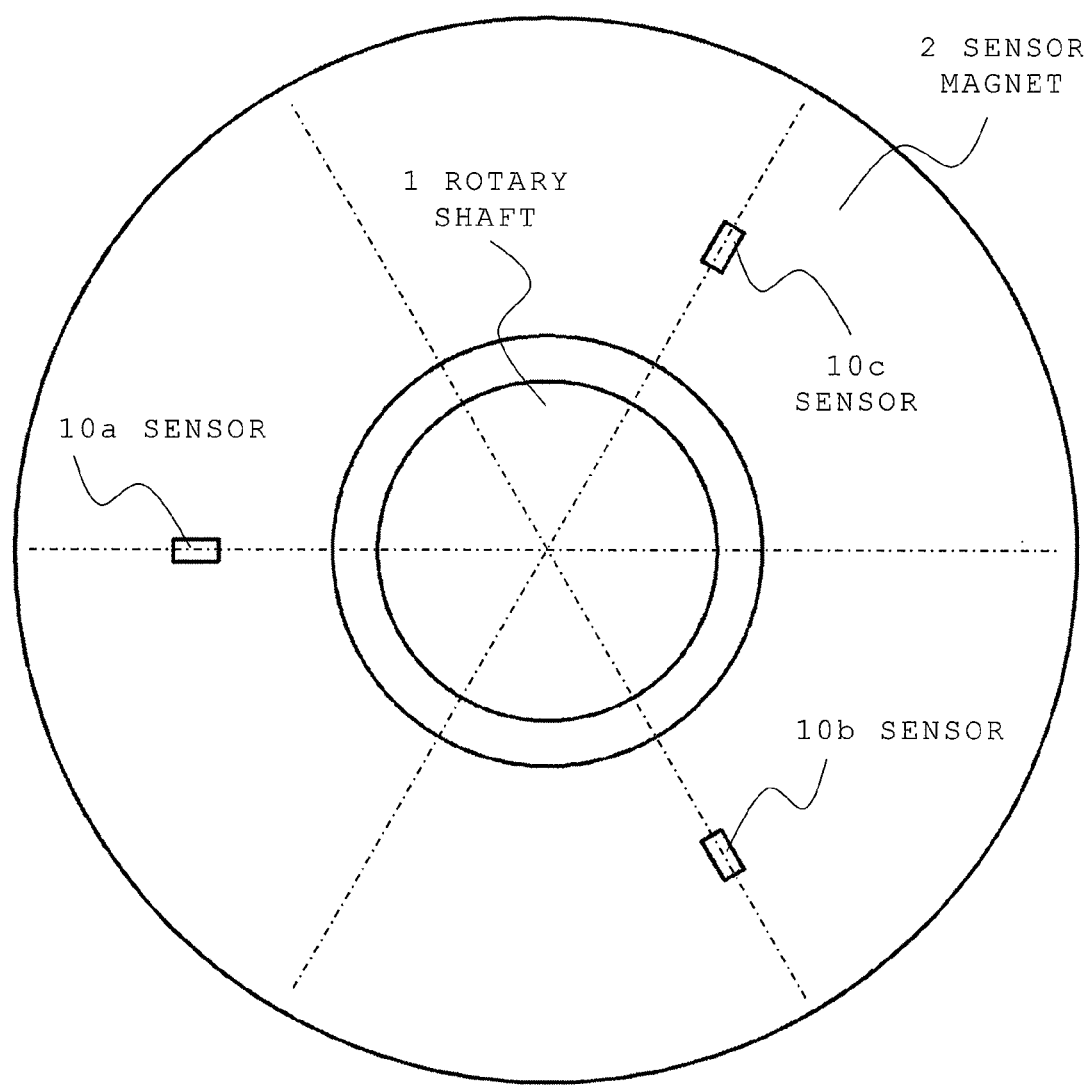
FIG. 18 is a plan view for schematically illustrating relative positions of the rotary shaft, the sensor magnet, and semiconductor sensors of the magnetic resistance type in an angle detection device according to a second embodiment of the present invention.

In an angle detection device according to a second embodiment of the present invention illustrated in FIG. 18, the sensor 10b is arranged at the position having the phase advanced by 120 degrees with respect to the sensor 10a, and a sensor 10c is arranged at a position having a phase lagged by 120 degrees with respect to the sensor 10a.

For example, when the sine signal V sin 1 and the cosine signal V cos 1 of the sensor 10a can be given by Expression (1), the sine signal V sin 2 and the cosine signal V cos 2 of the sensor 10b can be given by Expression (2). On this occasion, a sine signal V sin 3 and a cosine signal V cos 3 of the sensor 10c can be given by Expression (11).

$$\begin{cases} V_{cos3} = a_1\cos(\theta - 120) - a_3\cos 3\theta + a_5\cos(5\theta + 120) - \\ \quad a_7\cos(7\theta - 120) + \Lambda \\ V_{sin3} = d_1\sin(\theta - 120) - d_3\sin 3\theta + d_5\sin(5\theta + 120) - \\ \quad d_7\sin(7\theta - 120) + \Lambda \end{cases}$$ Expression (11)

The method of calculating the rotation angle from the sensor 10a and the sensor 10b are the same as that described in the first embodiment, and a description thereof is therefore omitted.

In order to calculate the rotation angle from the sensor 10a and the sensor 10c, it is only required to obtain the corrected sine signal V sin and the corrected cosine signal V cos in accordance with Expression (12).

$$\begin{cases} V_{cos} = V_{cos3} - V_{cos1} \\ \quad = \sqrt{3}\begin{Bmatrix} a_1\cos(\theta - 150) + a_5\cos(5\theta + 150) - \\ a_7\cos(7\theta - 150) + \Lambda \end{Bmatrix} \\ V_{sin} = V_{sin3} - V_{sin1} \\ \quad = \sqrt{3}\begin{Bmatrix} d_1\sin(\theta - 150) + d_5\sin(5\theta + 150) - \\ d_7\sin(7\theta - 150) + \Lambda \end{Bmatrix} \end{cases}$$ Expression (12)

The angle is calculated by subtracting signals having the same phase from the signals having the phase displaced by 120 degrees, and an angle obtained by displacing the phase by 150 degrees is the rotation angle to be calculated. Therefore, the rotation angle θ is given by Expression (13).

$$\theta = \tan^{-1}\left(\frac{kV_{sin}}{V_{cos}}\right) + 150 \text{ [deg]}$$ Expression (13)

As shown in FIG. 9, the amplitudes of the fundamental waves of the corrected sine signal V sin and the corrected cosine signals V cos are different from each other, and hence a coefficient k may be set to a ratio between the amplitudes of the respective fundamental waves. This coefficient k may be set to be equivalent to the coefficient k used when the rotation angle θ is calculated from the sensor 10a and the sensor 10b. In this case, a memory capacity can be saved, or the processing may be simplified. On this occasion, a simple arctangent function is used, but it should be understood that signals corrected through publicly known methods may be used when the respective signals include errors, for example, offset errors. Moreover, in Expression (13), the corrected sine signal V sin is multiplied by the coefficient k, but it should be understood that the corrected cosine signal V cos may be multiplied by the coefficient k.

Figure 19:
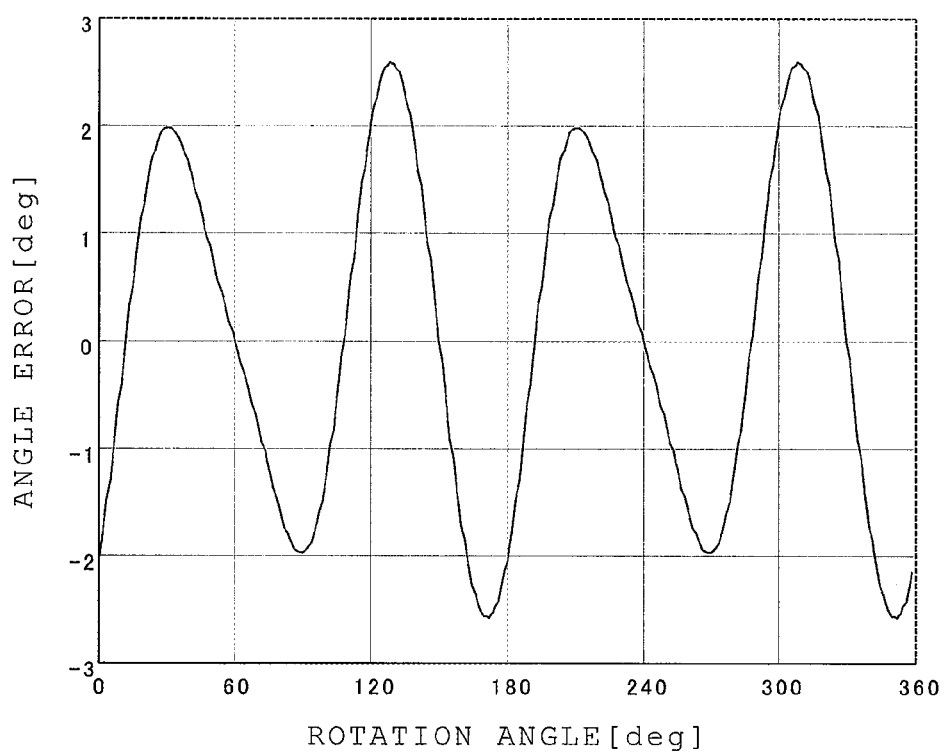
FIG. 19 is a waveform diagram for showing a rotation angle error after a calculated rotation angle is corrected once in the second embodiment of the present invention.

An angle error contained in the rotation angle θ obtained in accordance with Expression (13) is shown in FIG. 19.

In order to calculate the rotation angle from the sensor 10b and the sensor 10c, it is only required to obtain the corrected sine signal V sin and the corrected cosine signal V cos in accordance with Expression (14).

$$V_{cos} = V_{cos2} - V_{cos3}$$ Expression (14)
$$= \sqrt{3}\begin{Bmatrix} a_1\cos(\theta + 90) + a_5\cos(5\theta - 90) - \\ a_7\cos(7\theta + 90) + \Lambda \end{Bmatrix}$$

$$\begin{cases} V_{sin} = V_{sin2} - V_{sin3} \\ \quad = \sqrt{3}\begin{Bmatrix} d_1\sin(\theta + 90) + d_5\sin(5\theta - 90) - \\ d_7\sin(7\theta + 90) + \Lambda \end{Bmatrix} \end{cases}$$

In this manner, the angle is calculated by subtracting signals having the phase lagged by 120 degrees from the signals having the phase advanced by 120 degrees, and hence an angle obtained by displacing the phase by 90 degrees is the rotation angle to be calculated. Therefore, the rotation angle θ is given by Expression (15).

$$\theta = \tan^{-1}\left(\frac{kV_{sin}}{V_{cos}}\right) - 90 \text{ [deg]}$$ Expression (15)

As shown in FIG. 9, the amplitudes of the fundamental waves of the corrected sine signal V sin and the corrected cosine signals V cos are different from each other, and hence a coefficient k may be set to a ratio between the amplitudes of the respective fundamental waves. This coefficient k may be set to be equivalent to the coefficient k used when the rotation angle θ is calculated from the sensor 10a and the sensor 10b. In this case, a memory capacity can be saved, or the processing may be simplified. On this occasion, a simple arctangent function is used, but it should be understood that signals corrected through publicly known methods may be used when the respective signals include errors, for example, offset errors. Moreover, in Expression (15), the corrected sine signal V sin is multiplied by the coefficient k, but it should be understood that the corrected cosine signal V cos may be multiplied by the coefficient k.

Figure 20:
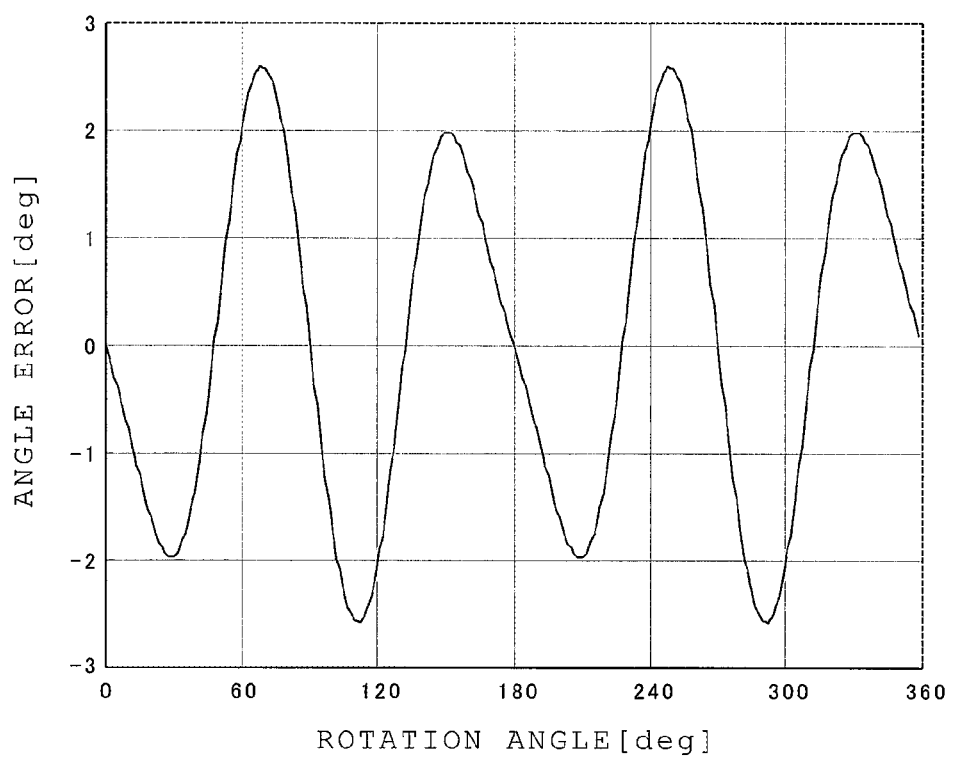
FIG. 20 is a waveform diagram for showing the angle error contained in the rotation angle of FIG. 19.

An angle error contained in the rotation angle θ obtained in accordance with Expression (15) is shown in FIG. 20.

The phases of the angle errors of FIG. 12 and FIG. 19 are different from each other by 120 degrees, and the phases of the angle errors of FIG. 19 and FIG. 20 are different from each other by 120 degrees. Thus, it can be found that a correction formula having a displaced phase is only required to be used when the rotation angle θ is corrected to calculate the rotation angle θ' corrected once, or a rotation angle corrected m times. In other words, a similar correction method can be applied to any one of the combinations. For example, for the rotation angle θ obtained in accordance with Expression (13), the rotation angle θ' corrected once and the rotation angle θ" corrected twice can be calculated in accordance with Expression (16). Moreover, for the rotation angle θ obtained in accordance with Expression (15), the rotation angle θ' corrected once and the rotation angle θ" corrected twice can be calculated in accordance with Expression (17).

Expression (16)
$$\begin{cases} \theta' = \theta - k_4 \sin 4(\theta - 120) - k_6 \sin 6(\theta - 120) - k_8 \sin 8(\theta - 120) \\ \theta'' = \theta - k_4 \sin 4(\theta' - 120) - k_6 \sin 6(\theta' - 120) - k_8 \sin 8(\theta' - 120) \end{cases}$$

Expression (17)
$$\begin{cases} \theta' = \theta - k_4 \sin 4(\theta + 120) - k_6 \sin 6(\theta + 120) - k_8 \sin 8(\theta + 120) \\ \theta'' = \theta - k_4 \sin 4(\theta' + 120) - k_6 \sin 6(\theta' + 120) - k_8 \sin 8(\theta' + 120) \end{cases}$$

Figure 21:
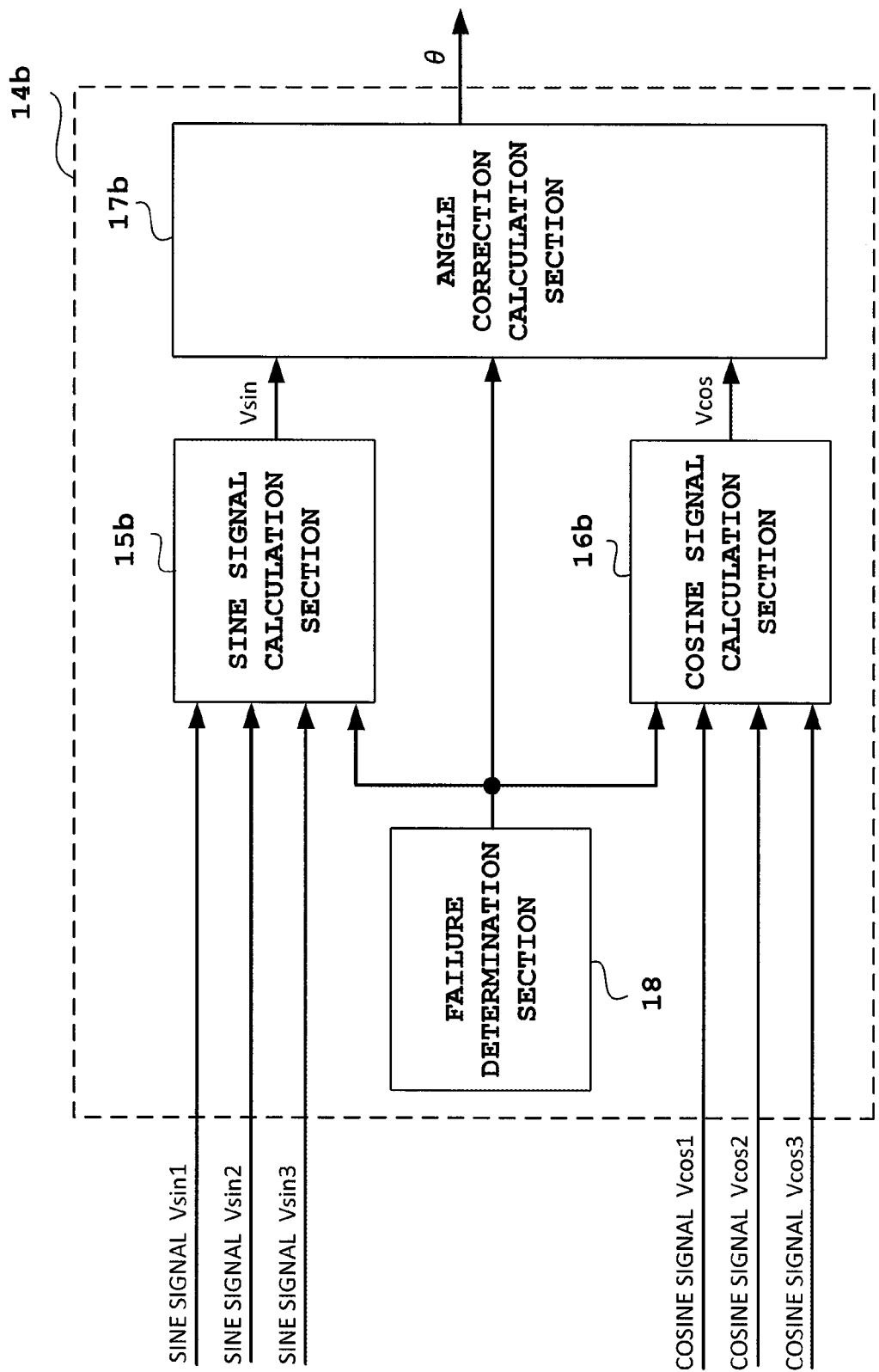
FIG. 21 is a block diagram for illustrating an example of an internal configuration of an angle calculation section of the angle detection device according to the second embodiment of the present invention.

As described above, the similar correction can be made for any of the combinations of the three sensors, and hence, in the second embodiment, an angle correction calculation section 17b is used as illustrated in FIG. 21. In FIG. 21, a failure determination section 18 determines whether each of the sensors 10a to 10c is normal or abnormal to output a failure determination signal. The combination of the sensors used to calculate the rotation angle is determined in accordance with the failure determination signal.

A sine signal calculation section 15b uses a combination of normal sensors to generate the corrected sine signal V sin in accordance with the failure determination signal acquired from the failure determination section 18. When a combination of the sensor 10a and the sensor 10b, a combination of the sensor 10c and the sensor 10a, and a combination of the sensor 10b and the sensor 10c are used, the corrected sine signal V sin is only required to be calculated in accordance with Expression (3), Expression (12), and Expression (14), respectively.

A cosine signal calculation section 16b uses a combination of two normal sensors to generate the corrected cosine signal V cos in accordance with the failure determination signal acquired from the failure determination section 18. When the combination of the sensor 10a and the sensor 10b, the combination of the sensor 10c and the sensor 10a, and the combination of the sensor 10b and the sensor 10c are used, the corrected cosine signal V cos is only required to be calculated in accordance with Expression (4), Expression (12), and Expression (14), respectively.

The angle correction calculation section 17b calculates the rotation angle θ from the corrected sine signal V sin and the corrected cosine signal V cos in accordance with the failure determination signal from the failure determination section 18. When the combination of the sensor 10a and the sensor 10b, the combination of the sensor 10c and the sensor 10a, and the combination of the sensor 10b and the sensor 10c are used, the rotation angle θ is only required to be calculated in accordance with Expression (5), Expression (13), and Expression (15), respectively.

Moreover, a rotation angle corrected m times may be calculated, and when the combination of the sensor 10a and the sensor 10b, the combination of the sensor 10c and the sensor 10a, and the combination of the sensor 10b and the sensor 10c are used, the rotation angle corrected m times is only required to be calculated in accordance with Expression (6) and Expression (7), Expression (16), and Expression (17), respectively. The correction is herein made in accordance with the correction formulae, but it should be understood that the same effect can be provided even when the correction is made in accordance with tables.

Figure 22:
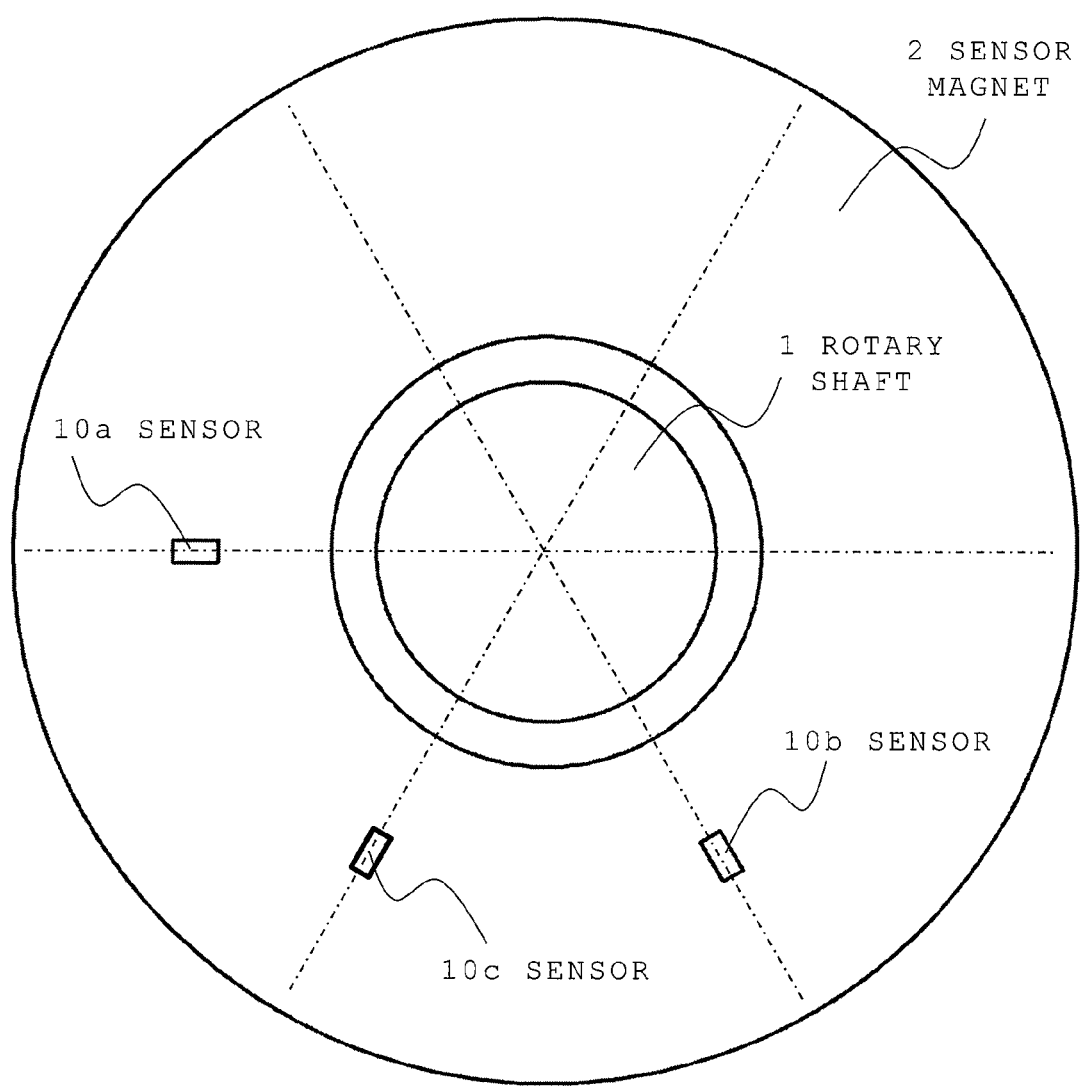
FIG. 22 is a plan view for schematically illustrating relative positions of the rotary shaft, the sensor magnet, and the semiconductor sensors of the magnetic resistance type in a state in which the three sensors are arranged at phase differences of 60 degrees in the angle detection device according to the second embodiment of the present invention.

As illustrated in FIG. 22, even when the sensors are arranged at an interval of 60 degrees, as long as the output signal acquired from the sensor 10c is inverted, the output signal becomes the same as the output signal acquired from the sensor 10c illustrated in FIG. 18. Thus, the same effect can be provided.

In this manner, through arrangement of the first and second sensors out of the plurality of sensors configured to output the sine signals and the cosine signal in accordance with the magnetic field on the two radial lines different from each other out of the three radial lines dividing the circumference about the rotary shaft of the sensor magnet into the six equal parts, when any one of the sensors fails, the rotation angle is calculated based on the sine signals and the cosine signals output by the remaining two sensors, and hence it is possible to decrease the angle error generated by the 3n-th (n is a natural number) order signal errors.

Moreover, the phases of the angle errors are displaced by 120 degrees from one another, and hence a similar correction formula or a similar correction table may be used for any one of the combinations. Thus, the effect of saving the memory capacity, which has not hitherto been provided, can be provided. It should be understood that additional correction may be made for each of the combinations depending on a variation in a sensor characteristic, a variation in manufacturing, or the like.

When the angle detection device according to the second embodiment is applied to an AC rotary machine configured to generate an assist torque for assisting steering by a driver, an electric power steering device in which torque ripple is decreased can be provided.

The invention claimed is:

1. An angle detection device, comprising:
   a sensor magnet, which is fixed to a rotary shaft, and is configured to generate a magnetic field for detecting a rotation angle;
   a plurality of sensors, which are arranged so as to be opposed to the sensor magnet, and are each configured to generate a sine signal and a cosine signal in accordance with the magnetic field, a first sensor and a second sensor of the plurality of sensors being arranged on two radial lines different from each other, respectively, out of three radial lines dividing a circumference about the rotary shaft of the sensor magnet into six equal parts; and
   an angle calculation unit configured to carry out calculation so that 3n-th order harmonic components, where n is a natural number, out of odd-order harmonic components of each of the sine signal and the cosine signal output by the first sensor and the second sensor cancel one another, to thereby calculate the rotation angle.

2. An angle detection device according to claim 1, wherein the first sensor and the second sensor are arranged on the radial lines at an interval of 120 degrees about the rotary shaft.

3. An angle detection device according to claim 1, wherein the first sensor and the second sensor are arranged on the radial lines at an interval of 60 degrees about the rotary shaft.

4. An angle detection device according to claim 1, wherein the plurality of sensors include the first sensor, the second sensor, and a third sensor.

5. An angle detection device according to claim 4, wherein the first sensor, the second sensor, and the third sensor are arranged on the radial lines at an interval of 120 degrees about the rotary shaft.

6. An angle detection device according to claim 4, wherein the first sensor, the second sensor, and the third sensor are arranged on the radial lines at an interval of 60 degrees about the rotary shaft.

7. An angle detection device according to claim 4, wherein the angle calculation unit includes a failure determination section configured to determine a failure state of each of the first sensor, the second sensor, and the third sensor, and is configured to set two sensors that are determined not to be failed by the failure determination section out of the plurality of sensors as the first sensor and the second sensor, to thereby calculate the rotation angle.

8. An angle detection device according to claim 7, wherein the angle calculation unit is configured to:
calculate the rotation angle from a corrected sine signal obtained from a sum of or a difference between the sine signal output by the first sensor and the sine signal output by the second sensor and a corrected cosine signal obtained from a sum of or a difference between the cosine signal output by the first sensor and the cosine signal output by the second sensor;
calculate the rotation angle from a corrected sine signal obtained from a sum of or a difference between the sine signal output by the second sensor and the sine signal output by the third sensor and a corrected cosine signal obtained from a sum of or a difference between the cosine signal output by the second sensor and the cosine signal output by the third sensor; or
calculate the rotation angle from a corrected sine signal obtained from a sum of or a difference between the sine signal output by the third sensor and the sine signal output by the first sensor and a corrected cosine signal obtained from a sum of or a difference between the cosine signal output by the third sensor and the cosine signal output by the first sensor.

9. An angle detection device according to claim 1, wherein the angle calculation unit is configured to calculate the rotation angle from a corrected sine signal obtained from a sum of or a difference between the sine signal output by the first sensor and the sine signal output by the second sensor and a corrected cosine signal obtained from a sum of or a difference between the cosine signal output by the first sensor and the cosine signal output by the second sensor.

10. An angle detection device according to claim 8, wherein the angle calculation unit is configured to multiply any one of the corrected sine signal and the corrected cosine signal by a ratio between amplitudes of fundamental waves of the corrected sine signal and the corrected cosine signal, to thereby calculate the rotation angle.

11. An angle detection device according to claim 8, wherein the angle calculation unit is configured to add an initial phase of the corrected sine signal and the corrected cosine signal, which is determined by the arrangement of the sensor magnet and the plurality of sensors, to thereby calculate the rotation angle.

12. An angle detection device according to claim 9, wherein the angle calculation unit is configured to subtract from the rotation angle a sum of 2n-th order harmonic components of the corrected sine signal based on the calculated rotation angle, where n is a natural number of 2 or more, to thereby carry out calculation of correcting the rotation angle at least once.

13. An angle detection device according to claim 12, wherein the angle calculation unit is configured to carry out the calculation of correcting the rotation angle through use of a table representing a relationship between the rotation angle and an angle error correction value, which is set in advance.

14. An electric power steering device, comprising:
the angle detection device of claim 1; and
an AC rotary machine configured to generate an assist torque for assisting steering by a driver.

15. An angle detection device according to claim 1, wherein each of the plurality of sensors are disposed to face an axially facing surface of the sensor magnet that is perpendicular to a rotation axis of the rotary shaft.

16. An angle detection device according to claim 15, wherein each of the plurality of sensors are disposed radially distant from the rotation axis.

* * * * *